(12) United States Patent
Miura et al.

(10) Patent No.: US 7,211,850 B2
(45) Date of Patent: May 1, 2007

(54) SEMICONDUCTOR DEVICE WITH SPECIFICALLY SHAPED CONTACT HOLES

(75) Inventors: Jirou Miura, Kawasaki (JP); Mitsushi Fujiki, Kawasaki (JP); Aki Dote, Kawasaki (JP); Tomohiro Takamatsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 7 days.

(21) Appl. No.: 10/860,577

(22) Filed: Jun. 4, 2004

(65) Prior Publication Data

US 2005/0072998 A1 Apr. 7, 2005

(30) Foreign Application Priority Data

Oct. 7, 2003 (JP) .............................. 2003-348610

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ...................... 257/295; 257/296; 257/310; 257/773; 257/774

(58) Field of Classification Search ........ 257/295–296, 257/310, 773–774
See application file for complete search history.

(56) References Cited

U.S. PATENT DOCUMENTS

| | | | | |
|---|---|---|---|---|
| 5,767,541 A | * | 6/1998 | Hanagasaki | ................. 257/295 |
| 5,990,508 A | * | 11/1999 | Shinohara | .................... 257/295 |
| 6,072,242 A | * | 6/2000 | Son | ............................. 257/774 |
| 6,174,766 B1 | * | 1/2001 | Hayashi et al. | ............. 438/241 |
| 6,200,821 B1 | * | 3/2001 | Baek | ............................. 438/3 |
| 6,229,167 B1 | * | 5/2001 | Ozawa | ........................ 257/295 |
| 6,351,006 B1 | * | 2/2002 | Yamakawa et al. | ......... 257/310 |
| 6,600,185 B1 | * | 7/2003 | Tani et al. | ................... 257/296 |
| 6,708,405 B2 | * | 3/2004 | Hasler et al. | ................. 29/852 |
| 6,809,360 B2 | * | 10/2004 | Kato | ........................... 257/295 |
| 6,927,436 B1 | * | 8/2005 | Ami et al. | ................... 257/295 |
| 6,953,950 B2 | * | 10/2005 | Sashida | ........................ 257/69 |
| 2002/0011615 A1 | * | 1/2002 | Nagata et al. | ............... 257/295 |
| 2003/0170919 A1 | * | 9/2003 | Song et al. | ..................... 438/3 |
| 2003/0222299 A1 | * | 12/2003 | Miura | ........................ 257/306 |
| 2003/0227046 A1 | * | 12/2003 | Ando et al. | ................. 257/310 |
| 2004/0033672 A1 | * | 2/2004 | Matsuura et al. | ........... 438/396 |
| 2005/0244988 A1 | * | 11/2005 | Wang et al. | .................... 438/3 |

FOREIGN PATENT DOCUMENTS

| | | |
|---|---|---|
| JP | 3045928 | 5/2000 |
| JP | 3165093 | 5/2001 |

OTHER PUBLICATIONS

Patent Abstracts of Japan, Publication No. 4-162652, dated Jun. 8, 1992.
Patent Abstracts of Japan, Publication No. 2001-351920, dated Dec. 21, 2001.

* cited by examiner

*Primary Examiner*—Ida M. Soward
(74) *Attorney, Agent, or Firm*—Armstrong, Kratz, Quintos, Hanson & Brooks, LLP (57) ABSTRACT

An interlayer insulating film covering a ferroelectric capacitor is formed, and through the interlayer insulating film, contact holes each reaching a capacitor electrode are formed. A wiring connected to the capacitor electrode through the contact hole is further formed above the interlayer insulating film. A planar shape of the contact hole is a regular octagon, a regular rectangle with four angles thereof being rounded, an octagon with a length of each neighboring side thereof being different to each other, a circle, and so forth.

7 Claims, 7 Drawing Sheets

SEMICONDUCTOR DEVICE WITH SPECIFICALLY SHAPED CONTACT HOLES

CROSS-REFERENCE TO RELATED APPLICATIONS

This application is based upon and claims the benefit of priority from the prior Japanese Patent Application No. 2003-348610, filed on Oct. 7, 2003, the entire contents of which are incorporated herein by reference.

BACKGROUND OF THE INVENTION

1. Field of the Invention

The present invention relates to a semiconductor device suitable for a ferroelectric memory, and a manufacturing method thereof.

2. Description of the Related Art

For a semiconductor device having a ferroelectric capacitor, an annealing treatment in the oxygen atmosphere after forming a capacitor film is dispensable so that characteristics of a ferroelectric film are enhanced. Accordingly, materials not easily oxidizable are used as materials for capacitor electrodes to sandwich the ferroelectric film, or materials oxidizable but securing sufficient conductivity even after being oxidized used as the materials. Metals of the platinum family such as platinum or iridium, and oxides of platinoid elements such as $IrO_x$ are used as the materials.

Further, in order to connect the ferroelectric capacitor and other elements, an interlayer insulating film is formed in such a manner that it covers the ferroelectric capacitor; contact holes each reaching each capacitor electrode are formed through the interlayer insulating film; and a wiring contacting each capacitor electrode through each contact hole is formed above the interlayer insulating film. Aluminum is used as a material for the wiring in general, which is also used for other semiconductor devices such as a memory. The planar shape of the contact hole is a regular rectangle. The thickness of the ferroelectric film is thicker compared to films constituting other elements, and the size of the ferroelectric capacitor in the vertical direction (thickness) is relatively large. This means that the contact hole reaching to the capacitor electrode is deep.

Meanwhile, a barrier metal film such as a TiN (titanium nitride) film is formed between the capacitor electrode and the aluminum wire, as described in the Patent Document 1 (Japanese Patent No. 3045928) and the Patent Document 2 (Japanese Patent No. 3165093) shown below, since reaction occurs between aluminum and the metals of the platinum family such as platinum.

However, conventionally the coverage of the TiN film formed within the deep contact hole described above is not superior, and in some cases the film cannot prevent reaction between platinum and aluminum from occurring. Consequently, contact failure arises or large upward rising occurs, both of which may affect the upper wiring in some cases.

Prior arts are described in the Patent Document 1 (Japanese Patent No. 3045928), the Patent Document 2 (Japanese Patent No. 3165093), Patent Document 3 (Japanese Patent Application Laid-open No. Hei 4-162652), and Patent Document 4 (Japanese Patent Application Laid-open No. 2001-351920).

SUMMARY OF THE INVENTION

It is an object of the present invention to provide a semiconductor device in which connection between a wire and an electrode of a ferroelectric capacitor is superior, and a manufacturing method thereof.

As a result of dedicated investigations by the inventors to attain the above-described object of the present invention, following aspects of the invention are conceived.

A semiconductor device according to the present invention contains: a semiconductor substrate; a ferroelectric capacitor formed above the semiconductor substrate; an interlayer insulating film which covers the ferroelectric capacitor and through which a hole reaching an electrode of the ferroelectric capacitor is formed; and a wiring formed above the interlayer insulating film and connected to the electrode through the hole. The semiconductor device according to the present invention is characterized in that a planar shape of the hole is any one type selected from a group consisting of: (1) a polygon with an interior angle of each angle thereof being obtuse; (2) a closed curve with a bending direction thereof being constantly inward with respect to the hole; and (3) a shape which consists of a line segment and a curve with a bending direction thereof being constantly inward with respect to the hole, an angle between a tangent of the curve and the line segment at an intersection of the line segment and the curve being obtuse, and an interior angle of an intersection of two of the line segments being obtuse.

In a semiconductor device manufacturing method according to the present invention, a ferroelectric capacitor is formed above a semiconductor substrate, after which an interlayer insulating film which covers the ferroelectric capacitor is formed. A hole reaching an electrode of the ferroelectric capacitor is then formed through the interlayer insulating film. Then, a wiring which is connected to the electrode through the hole is formed above the interlayer insulating film. The semiconductor device manufacturing method according to the present invention is characterized in that, in the step of forming the hole, a planar shape of the hole is any one type selected from a group consisting of: (1) a polygon with an interior angle of each angle thereof being obtuse; (2) a closed curve with a bending direction thereof being constantly inward with respect to the hole; and (3) a shape which consists of a line segment and a curve with a bending direction thereof being constantly inward with respect to the hole, an angle between a tangent of the curve and the line segment at an intersection of the line segment and the curve being obtuse, and an interior angle of an intersection of two of the line segments being obtuse.

DETAILED DESCRIPTION OF THE PREFERRED EMBODIMENTS

Figure 1:
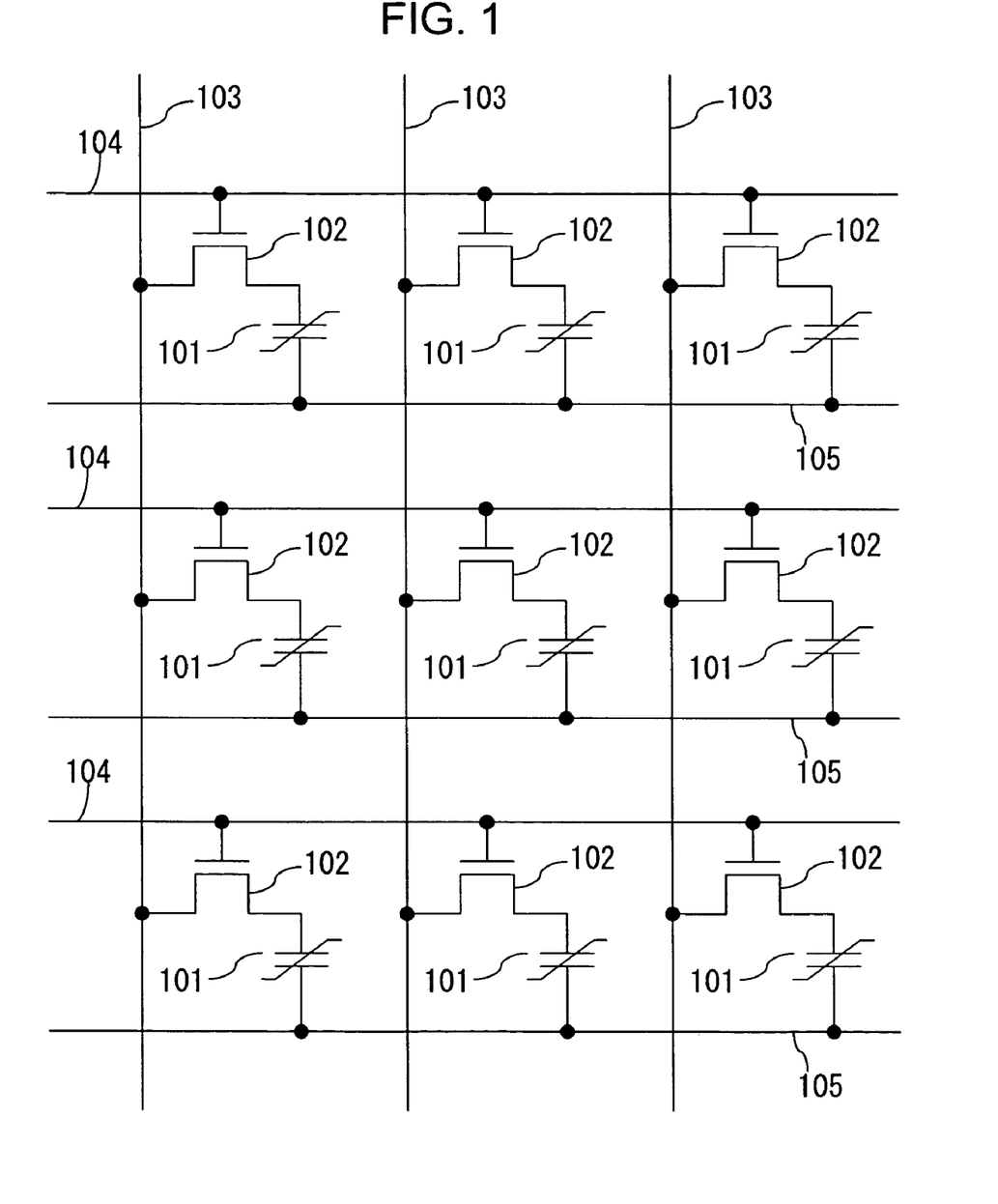
FIG. 1 is a circuit diagram showing a configuration of a memory cell array of a ferroelectric memory (a semiconductor device) according to an embodiment of the present invention.

Hereinafter, preferred embodiments of the present invention are specifically explained with reference to attached drawings. FIG. 1 is a circuit diagram showing a configuration of a memory cell array of a ferroelectric memory (semiconductor device) according to an embodiment of the present invention.

This memory cell array is provided with a plurality of bit lines 103 extending in a direction, a plurality of word lines 104 and plate lines 105 both extending in a direction vertical to the direction in which the bit lines 103 extend. Further, in a manner consistent with grids defined by the bid lines 103, word lines 104, and plate lines 105, a plurality of memory cells of the ferroelectric memory according to the present embodiment are arranged in array. Each memory cell is provided with a ferroelectric capacitor 101 and a MOS transistor 102.

A gate of the MOS transistor 102 is connected to the word line 104. Further, one source/drain of the MOS transistor 102 is connected to the bit line 103, while the other source/drain of the MOS transistor 102 is connected to one electrode of the ferroelectric capacitor 101. Meanwhile, the other electrode of the ferroelectric capacitor 101 is connected to the plate line 105. Additionally, each word line 104 and each plate line 105 are shared by the plural MOS transistors 102 arranged in the same direction as the direction in which the word line 104 and the plate line 105 extend. Similarly, each bit line 103 is shared by the plural MOS transistors 102 arranged in the same direction as the direction in which the bit line 103 extends. The direction in which the word lines 104 and the plate lines 105 extend, and the direction in which the bit lines 103 extend, may be in some cases called a row direction and a column direction, respectively.

In the memory cell array of the ferroelectric memory thus structured, data is stored according to the polarization state of a ferroelectric film provided in the ferroelectric capacitor 101.

Next, a manufacturing method of a semiconductor device (ferroelectric memory) according to an embodiment of the present invention will be explained. Note that as a matter of convenience, the structure of the semiconductor device, specifically a cross-sectional structure, will be explained herein together with the manufacturing method thereof. FIGS. 2A to 2K are cross-sectional views showing the manufacturing method of the semiconductor device (ferroelectric memory) according to an embodiment of the present invention, in order of the manufacturing steps.

Figure 2A:
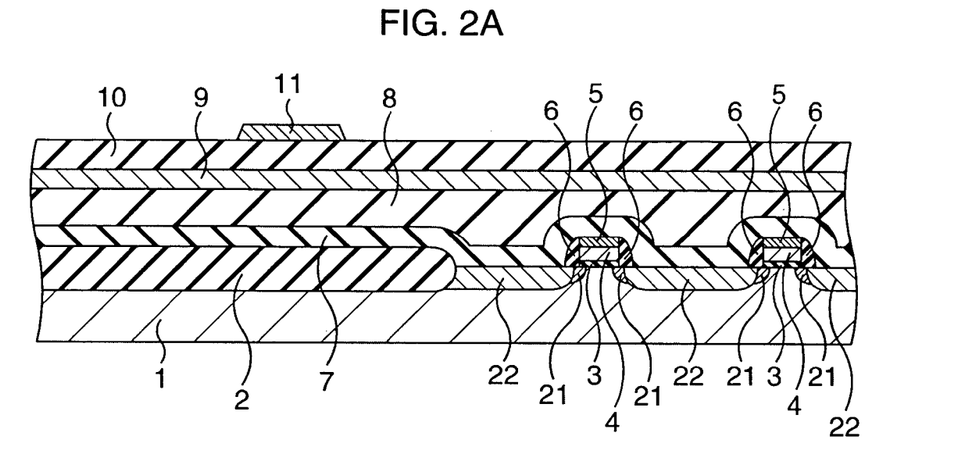
FIGS. 2A to 2K are sectional views to show a manufacturing method of the semiconductor device according to the present invention in order of manufacturing steps.

In the present embodiment, first, an element isolation insulating film 2 defining element active regions is formed on the surface of a semiconductor substrate 1 such as a silicon substrate, by using a LOCOS (local oxidation of silicon) method for example, as shown in FIG. 2A. Next, within the element active region defined by the element isolation insulating film 2, a transistor (MOSFET) is formed which contains a gate insulating film 3, a gate electrode 4, a siliside layer 5, and a sidewall 6, as well as source/drain diffusion layers consisting of a low-concentration diffusion layer 21 and a high-concentration diffusion layer 22. Subsequently, over the entire surface, a silicon oxynitride film 7 is formed in a manner of covering the MOSFET, and a silicon oxide film 8 is further formed over the entire surface. The silicon oxynitride film 7 is formed in order to prevent the hydrogen-induced degradation of the gate insulating film 3 and the like when the silicon oxide film 8 is formed.

Thereafter, a lower electrode film 9 and a ferroelectric film 10 are sequentially formed over the silicon oxide film 8. The lower electrode film 9 is formed, for example, of a titanium film and a platinum film formed thereon. The ferroelectric film 10 is formed, for example, of a PZT (Pb (Zr, Ti) O$_3$) film. Crystallization anneal is then performed on the ferroelectric film 10 in an oxygen atmosphere. An upper electrode film is then formed on the ferroelectric film 10. The upper electrode is patterned so that an upper electrode 11 is formed. The upper electrode is formed of an IrO$_x$ film, for example. Subsequently, oxygen anneal is performed in order to recover damages caused by the patterning using etching.

Figure 2B:
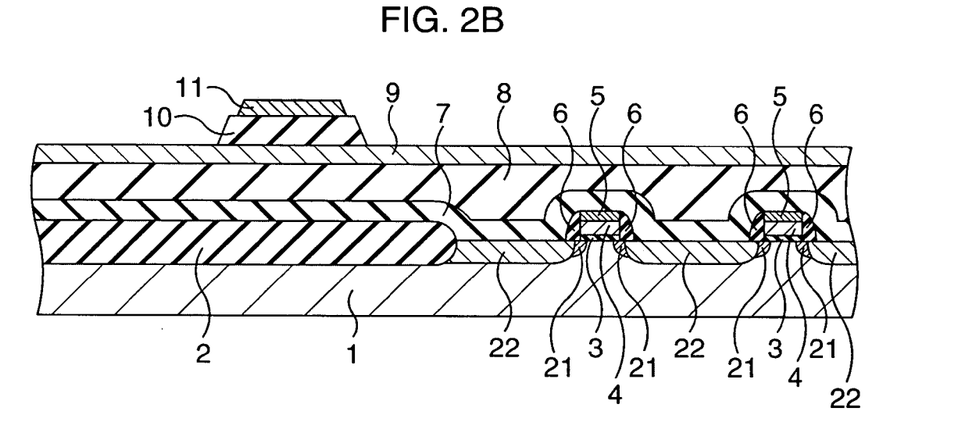
Figure 2C:
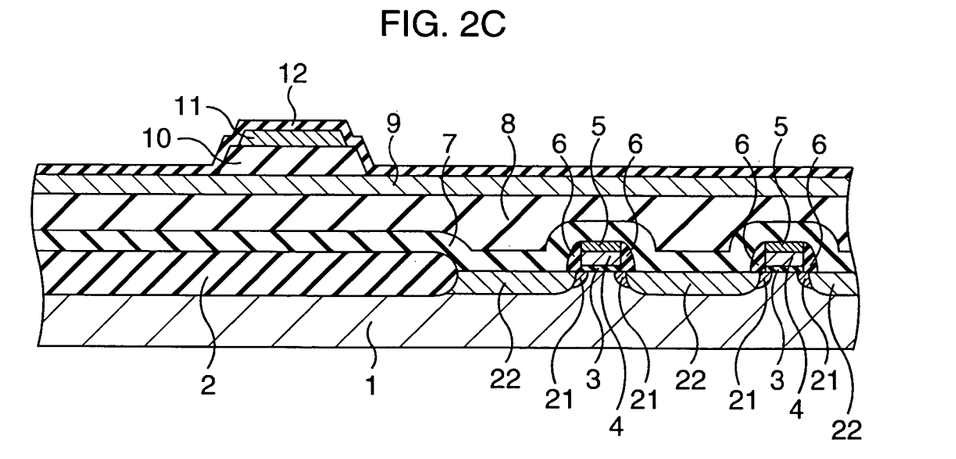

Thereafter, as shown in FIG. 2B, a capacitor insulation film is formed by patterning the ferroelectric film 10 by a sputtering method using a resist mask. Oxygen anneal is then performed in order to prevent peeling. Subsequently, as shown in FIG. 2C, an Al$_2$O$_3$ film 12 is formed as a protection film on the entire surface by a sputtering method. Oxygen anneal is then performed in order to reduce damages by the sputtering. The protection film prevents external entry of hydrogen to the ferroelectric capacitor.

Figure 2D:
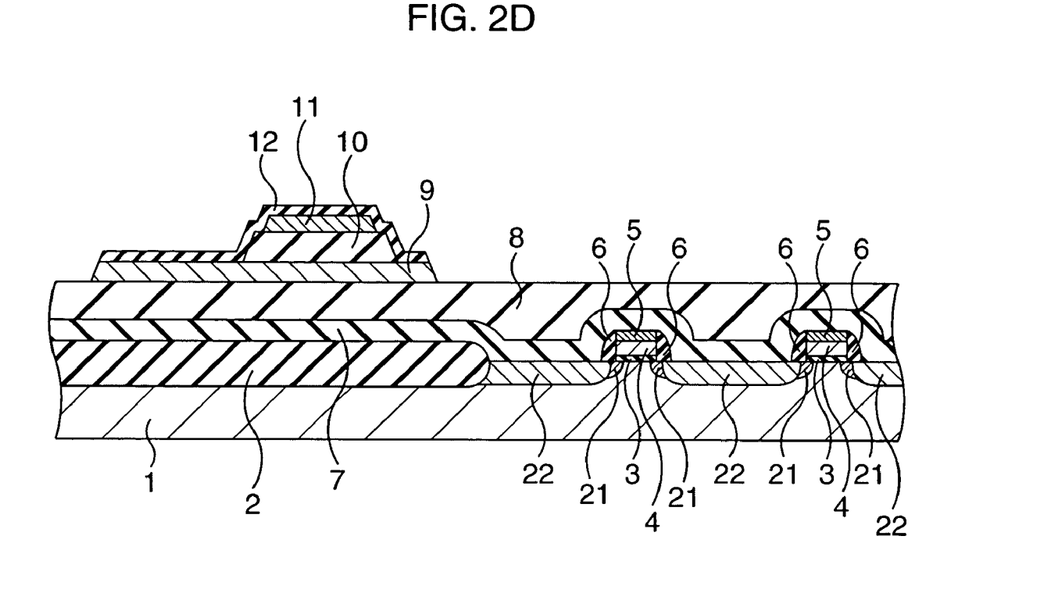
Figure 2E:
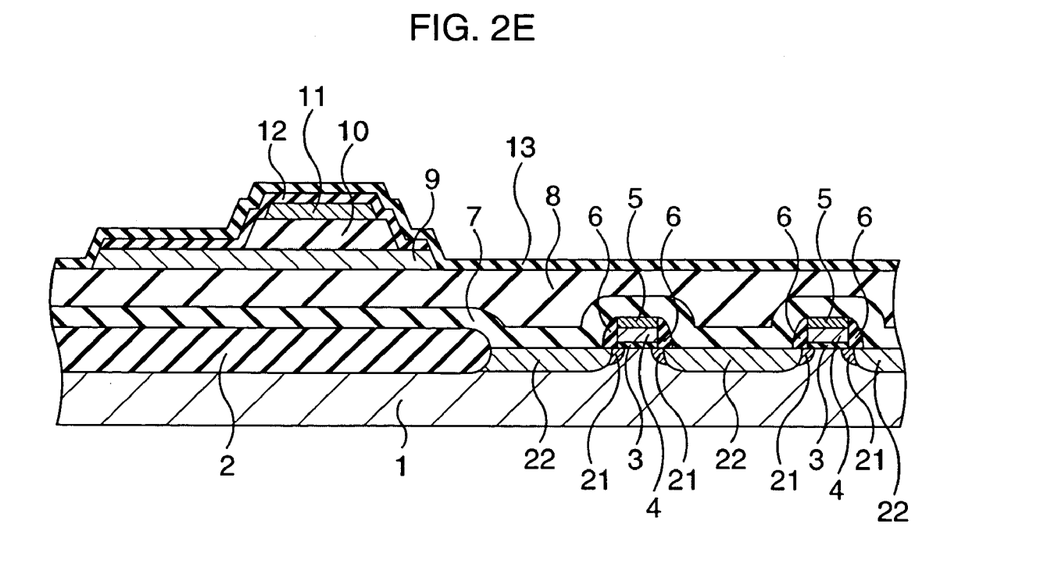

Subsequently, as shown in FIG. 2D, the Al$_2$O$_3$ film 12 and the lower electrode film 9 are patterned by a sputtering method using a resist mask, so that a lower electrode is formed. Oxygen anneal is then performed in order to prevent peeling. Subsequently, as shown in FIG. 2E, an Al$_2$O$_3$ film 13 is formed as a protection film over the entire surface by a sputtering method. Oxygen anneal is then performed in order to reduce capacitor leak.

Figure 2F:
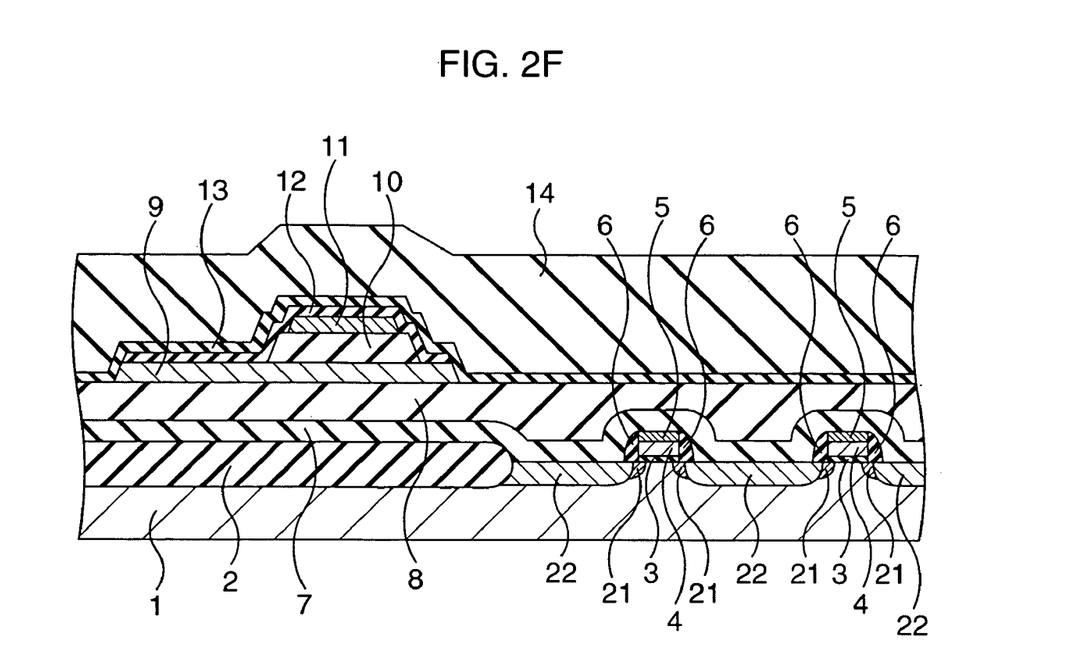
Figure 2G:
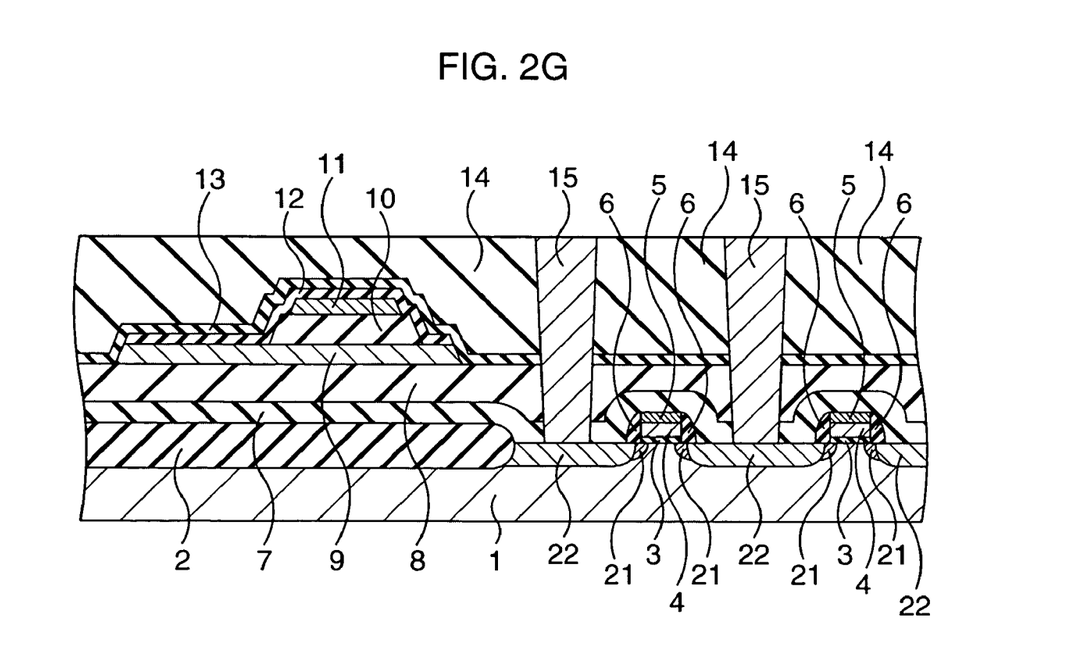

Thereafter, as shown in FIG. 2F, an interlayer insulating film 14 consisting of a silicon oxide film, for example, is formed over the entire surface. The thickness of the interlayer insulating film 14 is approximately 1.5 μm, for example. The interlayer insulating film 14 is then planarized by a CMP (chemical mechanical polishing) method as shown in FIG. 2G. Plasma processing is subsequently performed using N$_2$O gas. Contact holes reaching the high-concentration diffusion layer 22 of the transistor are then formed through the interlayer insulating film 14, the Al$_2$O$_3$ film 13, the silicon oxide film 8, and the silicon oxynitride film 7. After that, a TiN (titanium nitride) film is formed successively within each contact hole by a sputtering method, so that a barrier metal film (not shown) is formed. Further, within the contact hole, a tungsten film is buried by a CVD (chemical vapor deposition) method, and then planarized by a CMP method, so that a tungsten plug 15 is formed.

Figure 2H:
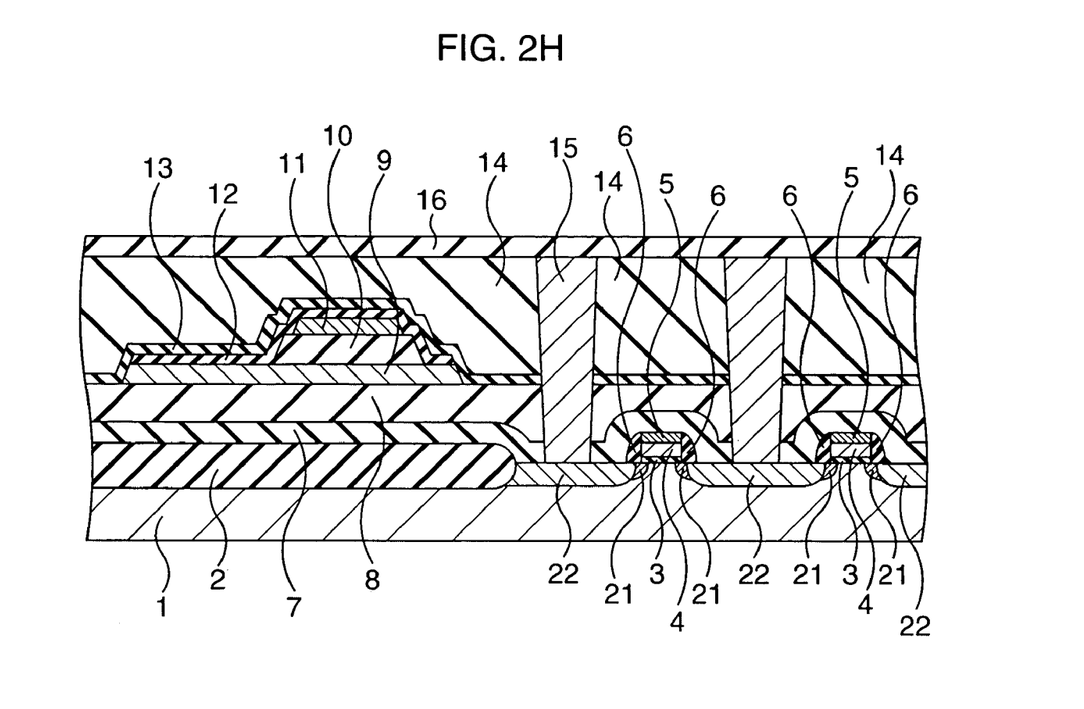
Figure 2I:
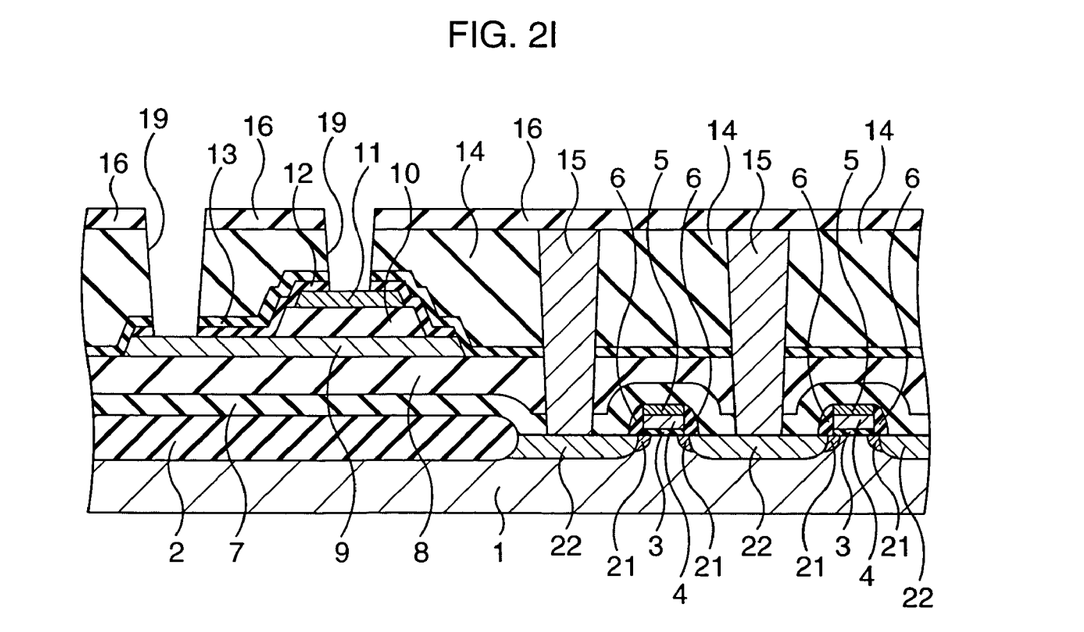

Subsequently, as shown in FIG. 2H, a SiON film 16 is formed as a film to prevent oxidation of the tungsten plug 15, by a plasma enhanced CVD method. As shown in FIG. 2I, a contact hole 19 reaching to the upper electrode 11 and a contact hole 19 reaching to the lower electrode (lower electrode film 9) are formed through the SiON film 16, the interlayer insulating film 14, the Al$_2$O$_3$ film 13 and the Al$_2$O$_3$ film 12. Oxygen anneal is then performed to recover damages.

Figure 3A:
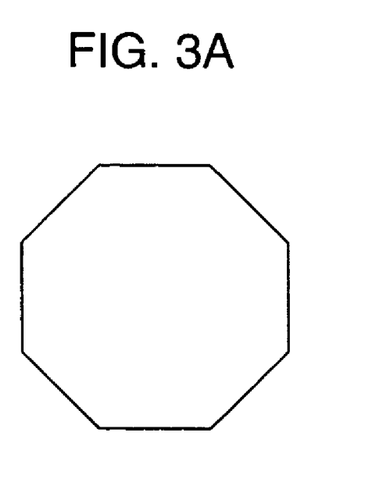
FIGS. 3A to 3D are schematic diagrams showing examples of planar shape of a contact hole.

In the present embodiment thus explained, the planar shape of the contact hole 19 reaching to the upper electrode 11 and the contact hole 19 reaching to the lower electrode (lower electrode film 9) is a regular octagon, for example, as shown in FIG. 3A.

Figure 2J:
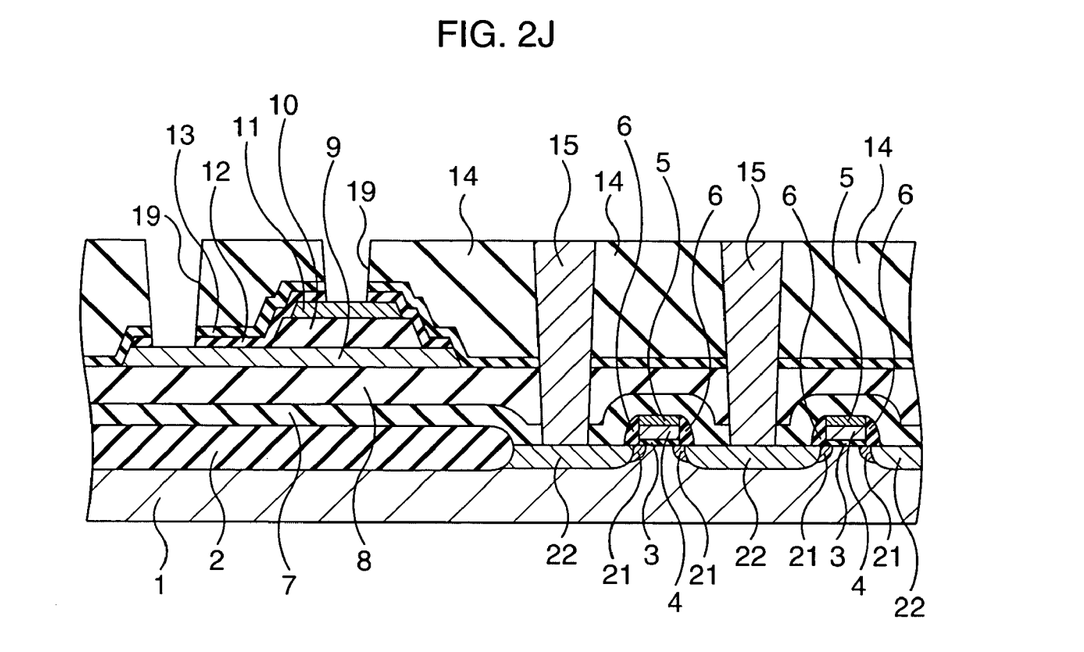
Figure 2K:
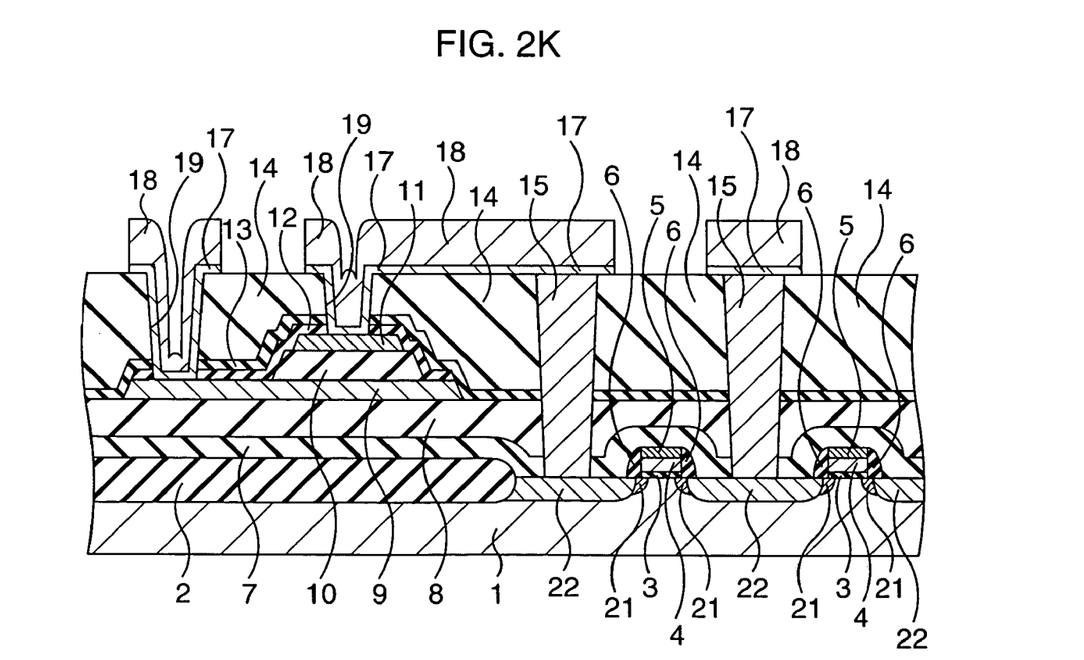

Thereafter, as shown in FIG. 2J, the SiON film 16 is removed from the entire surface by etchback, so that the surface of the tungsten plug 15 is exposed. Subsequently, as shown in FIG. 2K, in a state in which a part of the surface of the upper electrode 11, a part of the surface of the lower electrode (lower electrode film 9), and the surface of the tungsten plug 15 are exposed, the aluminum film and the TiN film are formed and patterned, so that aluminum wiring 18 and barrier metal film 17 consisting of TiN (titanium nitride) are formed. Here, for example, the tungsten plug 15 and the upper electrode 11 are connected to each other by a part of the aluminum wire 18.

Thereafter, the formation of an interlayer insulating film, the formation of a contact plug, the formation of wiring in the subsequent layers to the second layer from the bottom, and so forth are further performed. A cover film consisting of a TEOS oxide film and a SiN film, for example, is then formed, so that the ferroelectric memory having the ferroelectric capacitor is finished.

In the present embodiment as explained above, the planar shape of the contact holes reaching the capacitor electrodes (the lower electrodes and upper electrodes) are a regular octagon, as aforementioned. The interior angle of the regular octagon is 135 degrees, which is larger than the interior angle of the conventional regular rectangle shape (90 degrees) so that the TiN film constituting the barrier metal film 17 is formed within the contact hole 19 in a manner that allows superior coverage. Consequently, compared to the conventional semiconductor devices, reaction between the platinum forming the capacitor electrode and the aluminum forming the wiring are quite difficult to occur. Accordingly, occurrence of contact failure, deformation of the neighborhood of the contact portion, and the like which have conventionally occurred can be avoided.

Figure 3B:
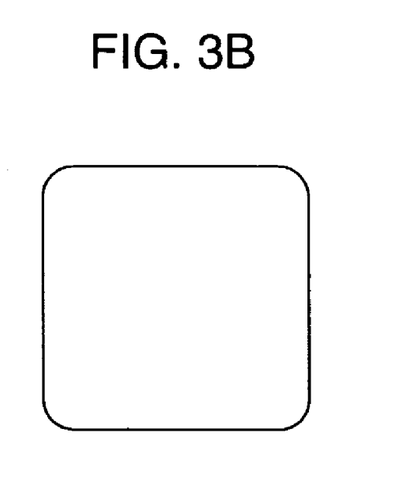
Figure 3C:
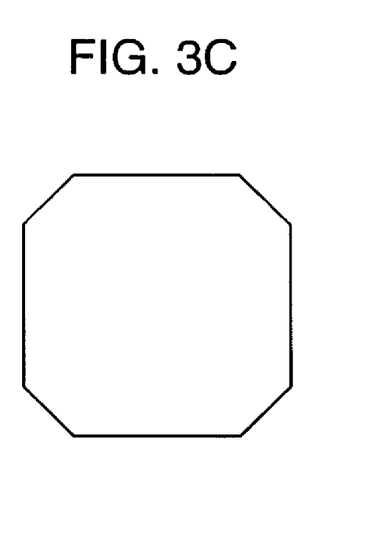
Figure 3D:
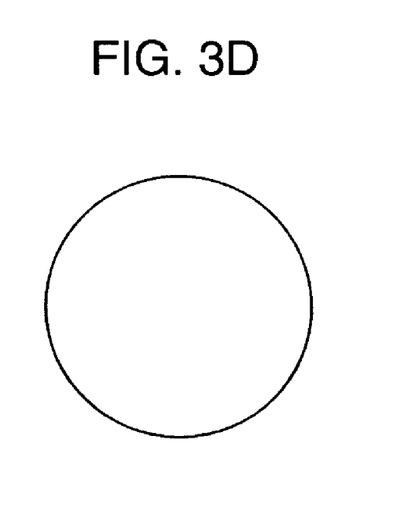

It should be noted that the planar shape of the contact hole reaching the capacitor electrode is not limitedly a regular octagon, but may be a circle or a regular polygon, a number of angles of which is identical to or more than that of a regular pentagon. Furthermore, in the case of the polygon (which consists of a plurality of line segments), all the interior angles of the angles of such a polygon may be obtuse. If the shape consists of a closed curve, its bending direction may be always inward with respect to the hole. Further, if the shape consists of a mixture of a line segment and a curve, in addition to the above conditions, an angle between a tangent of the curve and the line segment at their intersection may be obtuse. For example, the shape may be a regular rectangle with its four angles rounded as shown in FIG. 3B, an octagon with the length of each neighboring side thereof being different to each other as shown in FIG. 3C, or a circle as shown in FIG. 3D. FIG. 3B shows an example of the case where line segments and curves are mixed; FIG. 3C shows an example of the case where the planar shape consists of line segments; and FIG. 3D shows an example of the case where the planar shape consists of a curve. Furthermore, although not shown in a figure, the shape of the contact hole may be a shape such as an oval, or a polygon with the interior angles of each angle thereof being obtuse. The shape may be one like the polygon where the angles thereof are chamfered or rounded. As to the size of the contact hole, the shortest diameter thereof may be 1.0 µm or more, for example. Further, when forming such a contact hole, a resist pattern having an opening portion whose planar shape is identical to that of the contact hole to be formed (regular octagon, circle, or the like) may be formed. Such a resist pattern is used as a mask to perform etching of the interlayer insulating film, after which the resist pattern is removed.

Further, by forming the shape of the contact hole as described above, an effect is attained that stress does not easily concentrate to the angle portion of the contact hole. In manufacturing a semiconductor device with ferroelectric capacitors, often heat treatments are performed in plural times after the wiring contacting the electrode is formed. And if the planar shape of the contact hole is a regular rectangle as the conventional cases, such heat treatments cause stress to the angle portion so that peeling sometimes occur. In contrast, the present embodiment can deconcentrate such stress, so that the peeling and the like because of the stress can be prevented.

Further, while a planar-type ferroelectric capacitor is manufactured in the above-described embodiment, the present invention may be applied to a stack-type ferroelectric capacitor. In such a case, a contact plug such as a tungsten plug connected to a transistor such as a MOSFET may be connected to the lower electrode of the ferroelectric capacitor, for example.

Incidentally, the above-listed Patent Document 3 (Japanese Patent Application Laid-open No. Hei 4-162652) discloses that the planar-shape aspect ratio of a contact hole can be adjusted in order to prevent peeling. However, this method does not lighten the stress imposed on an angle of the contact hole, and in the process of the heat treatment and so forth after forming the wiring, the stress is concentrated on the angle of the contact hole, causing the peeling at the interface between the electrode and the wiring.

Furthermore, the Patent Document 4 (Japanese Patent Application Laid-open No. 2001-351920) discloses that the planar shape of the opening portion for a pad electrode should be an approximate circle so that when load or impact strength is imposed on the pad electrode, cracking of an insulating film surrounding the electrode can be prevented. However, the hole reaching the capacitor electrode (contact hole) is different from the pad opening portion in terms of usage, size and the like, so that the description that the planar shape of the pad opening portion should be an approximate circle or the like does not easily guide an idea that the shape of the contact hole can be a circle or the like in order for superior connection between the wiring and the capacitor electrode.

The present invention appropriately specifies the planar shape of the hole reaching the ferroelectric capacitor, so that the coverage of the film formed inside the hole becomes superior. Accordingly, even when materials for electrodes and wiring which may cause a reaction therebetween are selected, occurrence of such a reaction is prevented since a barrier meal film of superior coverage can be formed therebetween. Consequently, a semiconductor device of superior characteristics can be obtained, where such problems as peeling, deformation, and the like can be avoided.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
    a substrate;
    a ferroelectric capacitor formed above said substrate;
    an interlayer insulating film which covers said ferroelectric capacitor and through which a hole reaching an electrode of said ferroelectric capacitor is formed;
    a wiring formed above said interlayer insulating film and connected to said electrode through said hole, and
    a barrier metal film formed between said wiring and said electrode,
    a planar shape of said hole being any one type selected from a group consisting of:
    (1) a polygon with an interior angle of each angle thereof being obtuse;
    (2) a closed curve with a bending direction thereof being constantly inward with respect to said hole; and
    (3) a shape which consists of a line segment and a curve with a bending direction thereof being constantly inward with respect to said hole, an angle between a tangent of said curve and said line segment at an intersection of said line segment and said curve being obtuse, and an interior angle of an intersection of two of said line segments being obtuse;

wherein the barrier metal film formed within the contact hole is formed with superior coverage to the contact hole because of the shape of the contact hole, thereby avoiding contact failure and deformation around the contact portion.

2. The semiconductor device according to claim 1, wherein a shortest diameter of said hole is 1.0 μm or more.

3. The semiconductor device according to claim 1, wherein said electrode contains a metal of a platinum family or an oxide thereof.

4. The semiconductor device according to claim 1, wherein a planar shape of said hole is a circle, or a regular polygon whose number of angles is identical to or more than five.

5. The semiconductor device according to claim 1, wherein a planar shape of said hole is a shape that deconcentrate stress around the hole so that peeling between the electrode and the wiring can be prevented.

6. The semiconductor device according to claim 1, wherein said wiring is an aluminum wiring.

7. The semiconductor device according to claim 6, wherein said barrier metal film is a titanium nitride film.

* * * * *